United States Patent [19]

Yokokawa et al.

[11] Patent Number: 4,608,652

[45] Date of Patent: Aug. 26, 1986

[54] METHOD OF DISPLAYING A LOGIC SIGNAL

[75] Inventors: Hidemi Yokokawa, Tokyo; Miyuki Fukuzawa, Kanagawa, both of Japan

[73] Assignee: Sony/Tektronix Corporation, Tokyo, Japan

[21] Appl. No.: 448,544

[22] Filed: Dec. 10, 1982

[30] Foreign Application Priority Data

Feb. 16, 1982 [JP] Japan .................................. 57-23065

[51] Int. Cl.$^4$ ........................ G06F 15/626; G06F 5/00
[52] U.S. Cl. .................................... 364/521; 235/310; 364/481; 382/56
[58] Field of Search ............... 364/518, 521, 748, 749, 364/481; 382/44, 56; 358/260, 261, 140; 340/722, 347 DD; 235/310; 375/37, 53, 67

[56] References Cited

U.S. PATENT DOCUMENTS

| | | | |
|---|---|---|---|
| 3,804,975 | 4/1974 | Abe | 358/260 |
| 3,914,586 | 10/1975 | McIntosh | 235/310 |
| 4,058,674 | 11/1977 | Komura | 358/260 |
| 4,101,934 | 7/1978 | Fukuoka | 340/347 DD X |
| 4,409,621 | 10/1983 | Richards et al. | 358/260 |
| 4,446,516 | 5/1984 | Nishimura | 358/260 X |

OTHER PUBLICATIONS

Information Compression, Mar. 1975, "Block-Oriented Information Compression", H. Ling et al, pp. 141-145.
Electronics, Mar. 13, 1980 (vol. 53, No. 6), "On-Board Digital Processing Refines Scope Measurements", V. Garuts et al, pp. 105-114.
Electronic Prod. Design, Oct. 1980 (GB), "Internal Computer Automates Oscilloscope", D. Rolfe, pp. 45-48.
Electronics, Sep. 13, 1979 (vol 52, No. 19), "When Logic Analyzers Meet Development System", B. Farly, pp. 141-146.

Primary Examiner—Felix D. Gruber
Assistant Examiner—Kevin J. Teska
Attorney, Agent, or Firm—Dellett, Smith-Hill and Bedell

[57] ABSTRACT

A digital logic signal characterized by a bit sequence is displayed on a raster scan type screen in compressed form. The bit sequence is divided into N+1 bit segments and each bit of each segment, excluding the first bit of each segment, is compared to its preceding bit on a bit-by-bit, segment-by-segment basis. If a bit matches its preceding bit, a bit matching the preceding bit is generated. If a bit does not match its preceding bit, a bit opposite in state to the last bit produced is generated. The generated bits thus comprise a compressed sequence of N bit segments each corresponding to one N+1 bit segment of the original data sequence. A compressed waveform based on the generated sequence is then displayed.

5 Claims, 8 Drawing Figures

METHOD OF DISPLAYING A LOGIC SIGNAL

BACKGROUND OF THE INVENTION

The present invention relates generally to methods for displaying logic signals, and more specifically to a method of displaying a logic signal on a raster scan type display device.

In various kinds of electronic apparatus, logic signal processing techniques are performed by microprocessors and computers. Oscilloscopes, logic probes and logic analyzers are utilized for developing, calibrating and trouble-shooting an electronic apparatus using these logic techniques. A logic analyzer, in particular, is an ideal measurement instrument for such electronic apparatus because it can store multi-channel input logic signals (data) in a random access acquisition memory and display representations of the stored signals on a display means, such as a cathode ray tube (CRT), so that the signals can be measured. The logic analyzer is a convenient measurement instrument to use when a multi-channel measurement is required. There are two display modes typically utilized by logic analyzers. In a timing display mode the logic signal is displayed as a signal waveform, while in a state display mode the stored data is displayed as alphanumeric words, in binary, octal or hexadecimal form.

A raster scan type display device is suitable as a display means for logic analyzers since the raster scan type display device can display the data in both the timing and state display modes, in a flicker free fashion, even if a large amount of information is displayed.

Many conventional techniques have been proposed for displaying longer waveforms on a limited display area of a CRT. One such technique is the compression of the time (horizontal) axis of the display screen by changing the slope of an X-axis sweep signal to decrease the horizontal sweep rate. However, this technique is possible only in an X-Y type display CRT wherein the logic signal and a ramp or stair-case signal are supplied to the Y and X-axes of the display device, respectively. In a raster scanned CRT the number of FONTs (display segments) in a display area is predetermined and the number of bits in each FONT is also predetermined, and a raster scan type display cannot utilize the above-mentioned time-axis compression technique. Even if the number of FONTs in the display area is increased, the displayed waveforms are small as a result of the time-axis compression technique and it is difficult to observe the displayed waveforms in detail.

Another conventional technique involves display of a single channel logic signal with a plurality of separated traces (multi-trace method). However, the display area available for other channels is limited, making it difficult to display many channel signals at the same time.

Japanese Published Examined patent application No. 55-46579 discloses a logic analyzer which measures the time between transitions of an input logic signal in order to acquire the signal. This method may save memory capacity associated with an acquisition memory circuit since the acquired logic signal is compressed in time, but this method requires the use of an additional circuit in order to measure the elapsed time (period) between transitions. As a result, the construction of such a logic analyzer becomes significantly more complex.

Another conventional technique for displaying more waveform information on a CRT comprises reducing the amplitude of each logic waveform. However, it is then difficult to measure the logic waveforms as a result of the reduction in the amplitude. In addition, a scroll mode has been utilized for displaying long logic waveforms on a screen by gradually scrolling the waveforms across the screen, but this mode does not permit viewing the entire waveform at one time.

SUMMARY OF THE INVENTION

According to the present invention, an input digital logic signal comprising a sequence of binary bits is approximated by a shorter output digital logic signal. Each bit of each N+1 bit segment of the input signal starting with the second bit thereof is compared with the preceding bit. When the two bit states are equal, a bit of a corresponding output logic signal segment is generated having the same logic level as the preceding bit of the pair. When the input signal present bit differs from the preceding input signal bit, an output signal bit of a state differing from that of the most recently generated output signal bit is generated. The comparison is repeated for each N+1 bit segment of the input signal so that each corresponding output signal segment comprises N bits. The output logic signal is then converted into FONT information for display as a compressed logic waveform on a raster scan type display device.

It is therefore an object of the present invention to provide an improved method and apparatus for displaying a long waveform in compressed form on a limited display area of a raster scan type display.

It is another object to provide a logic signal display method for compressing a waveform consisting of a large number of bits, and displaying the compressed waveform on a limited display area of a display means in a raster scan type display manner, wherein a compression ratio may be selected as desired.

It is a further object to provide a logic signal display method, i.e., a page mode of a logic signal display, wherein probes and probe tips are selected as desired for each display screen (page), and input signals from the selected probes and probe tips of each page are displayed in one display area.

Other objects and advantages of the present invention will become apparent to those having ordinary skill in the art in view of the following specification taken in conjunction with the accompanying drawings.

DETAILED DESCRIPTION OF THE PREFERRED EMBODIMENT

Figure 1:
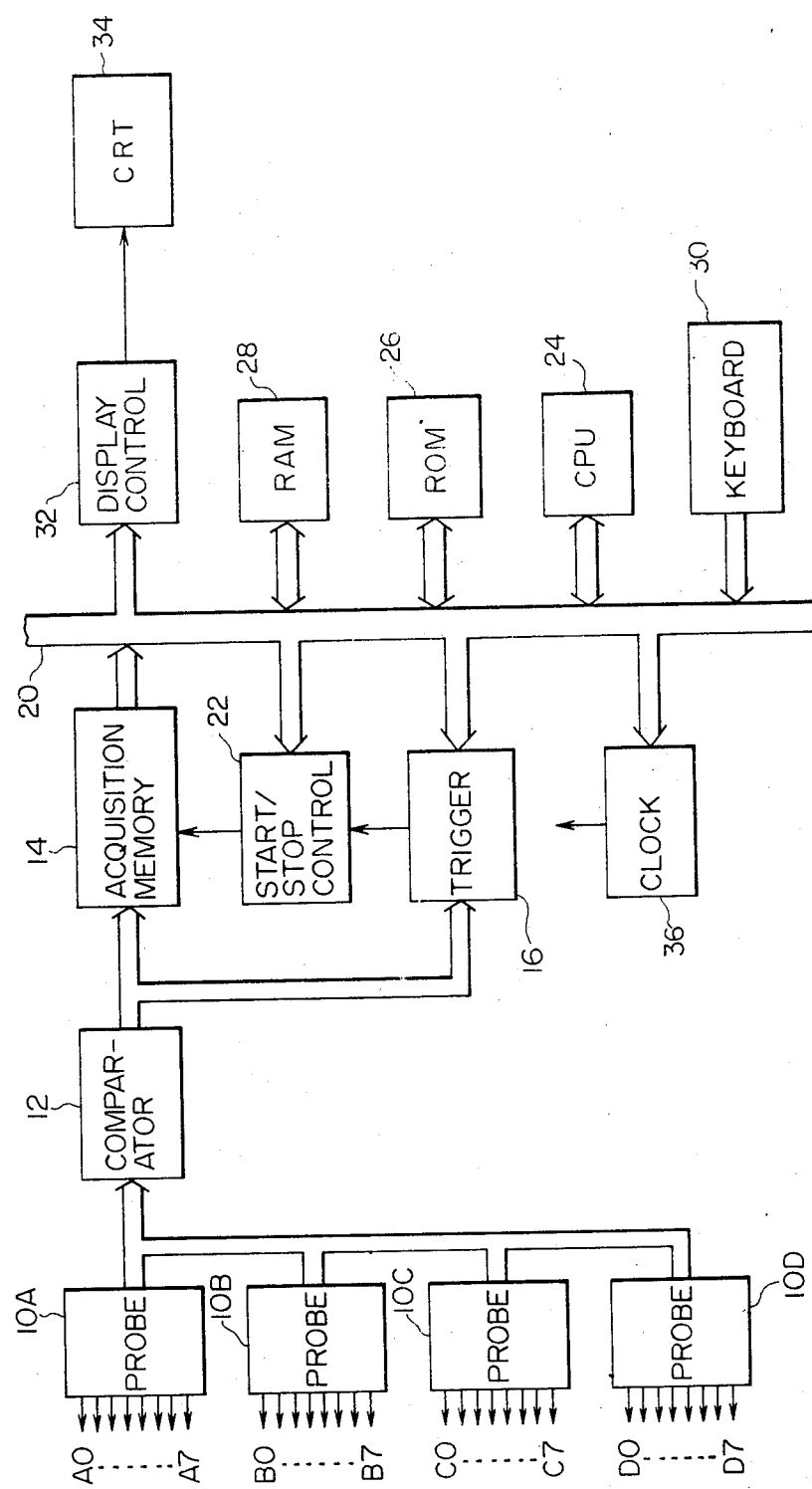
FIG. 1 illustrates a block diagram of a logic analyzer ulitizing the present invention.

Referring to FIG. 1, there is shown a block diagram of a logic analyzer utilizing the present invention. The logic input signals detected by four probes 10A–10D are applied to a comparator 12. Each probe has eight tips indicated by A0–A7, D0–D7, or the like, for receiving eight channel input logic signals. Comparator 12 compares the logic input signals with a predetermined level to adjust them to a predetermined logic level (such as the TTL level) proper for each block so as to apply them to a high speed random access acquisition memory 14 and a trigger circuit 16 which includes a word recognizer and a counter. Memory 14 and trigger circuit 16 are connected to a bus 20 having data, address and control lines. A start/stop control circuit 22 initiates acquisition of input data by memory 14 in accordance with an instruction signal from bus 20, and stops the acquisition of input data for storage in memory 14 in accordance with an output signal from trigger circuit 16. Bus 20 is connected to a central processing unit (CPU) 24 such as a type Z-80A microprocessor, a read only memory (ROM) 26, a RAM 28, a keyboard 30, display control apparatus 32, and a clock signal generator 36. CPU 24 acts a logic arithmetic means and a processing means for controlling the entire system by using RAM 28 as a temporary memory (CPU RAM) in accordance with firmware (processing procedures) stored in ROM 26. Keyboard 30 is an external device for inputting data by an operator. Clock signal generator 36 applies clock signals to each block in FIG. 1, and is of a type wherein the clock signal frequency is determined by a command signal from bus 20. For example, the clock frequency for CPU 24, ROM 26, RAM 28 and keyboard 30 is determined to be 4 MHz (assuming that CPU 24 is the Z-80A). Display control apparatus 32 is connected to a raster scan type display device 34, such as a CRT, and supplies a horizontal synchronizing signal, a vertical synchronizing signal and an intensity signal in accordance with the data from a display RAM area in RAM 28.

The operation of the logic analyzer shown in FIG. 1 will be discussed beginning with the acquisition of input data and ending with the display of the input data on the CRT.

An operator selects a proper probe from probes 10A–10D and connects it to a circuit to be measured. The steps to use in the operation of the logic analyzer are as follows:

1. When the operator initiates the acquisition of input data using keyboard 30, a start/stop control circuit 22 supplies a write (acquisition start) command signal to acquisition memory 14 in accordance with an instruction signal from CPU 24.
2. Memory 14 acquires a sequence of bits representing the states of an input logic signal from a selected probe by storing at sequential addresses the output state of comparator 12 on each occurrence of a system clock cycle.
3. When trigger circuit 16 detects a selected trigger word from the input data and counts a predetermined number of the clock signals, trigger circuit 16 applies an indicating signal to start/stop control circuit 22.
4. The start/stop control circuit 22 then supplies an acquisition stop signal to memory 14 to terminate the acquisition of input data by memory 14.
5. The operator initiates the display of data stored in memory 14 by using keyboard 30.
6. CPU 24 transfers the data stored in memory 14 to a first area in the CPU RAM area of RAM 28. When a waveform compression instruction according to the present invention is input by keyboard 30, a waveform compression process is accomplished as described hereinafter in detail. Waveform display data is then transferred as FONT information (for example, code signals) from the CPU RAM area of RAM 28 to the display RAM area thereof and stored therein. The contents of the display RAM area then control a waveform display on CRT 34.

As is understood from the above explanation, the present invention relates to the above described sixth step in the operation of the logic analyzer.

Figure 2:
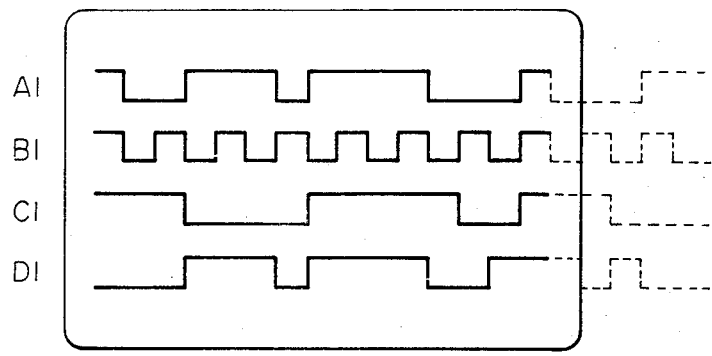
FIGS. 2 and 3 illustrate display screens for explaining a logic signal display method of the present invention.
Figure 3:
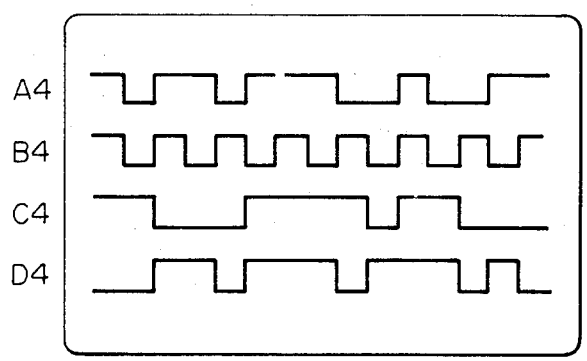

FIGS. 2 and 3 illustrate a display screen for explaining the waveform compression operation and method according to the present invention. FIG. 2 illustrates a display screen model when the data stored in the CPU RAM area of RAM 28 is displayed without compression (i.e., the normal display mode) wherein right side waveform portions drawn with dotted lines indicate the portions of the acquired waveforms which cannot be displayed on the screen. The symbols A1 and D1, shown at the left side of the waveforms in FIG. 2, represent labels referenced in the discussion herein and correspond to similar labels in FIG. 6 discussed hereinbelow. According to the logic signal display method of the present invention, the waveforms of FIG. 2 (including the dotted line portions) are compressed and displayed as shown in FIG. 3, wherein labels A4–D4 shown at the left side of the waveforms in FIG. 3 refer to the waveforms synthesized by compressing the waveforms A1–D1 of FIG. 2, respectively.

Figure 5:
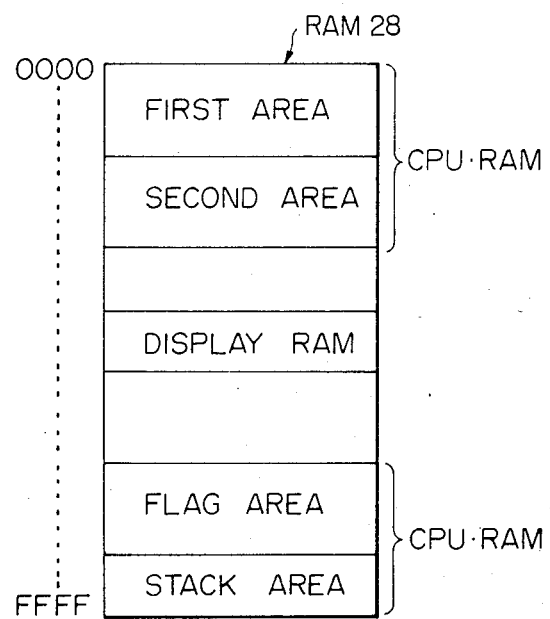
FIG. 5 illustrates the contents of a Random Access Memory (RAM) for explaining a logic signal display method of the present invention.
Figure 4:
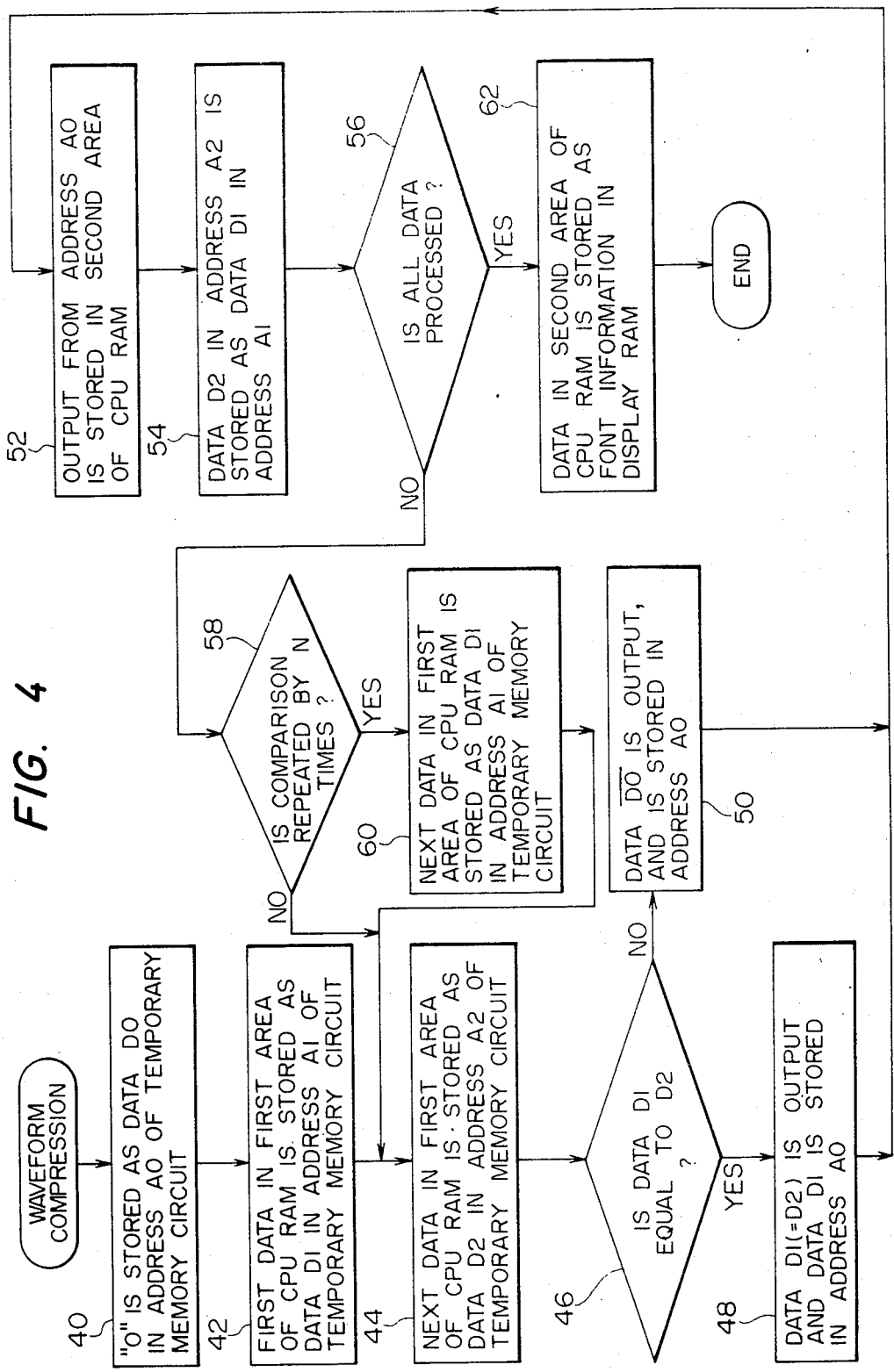
FIG. 4 is a flow chart for explaining a logic signal display method of the present invention.
Figure 6:
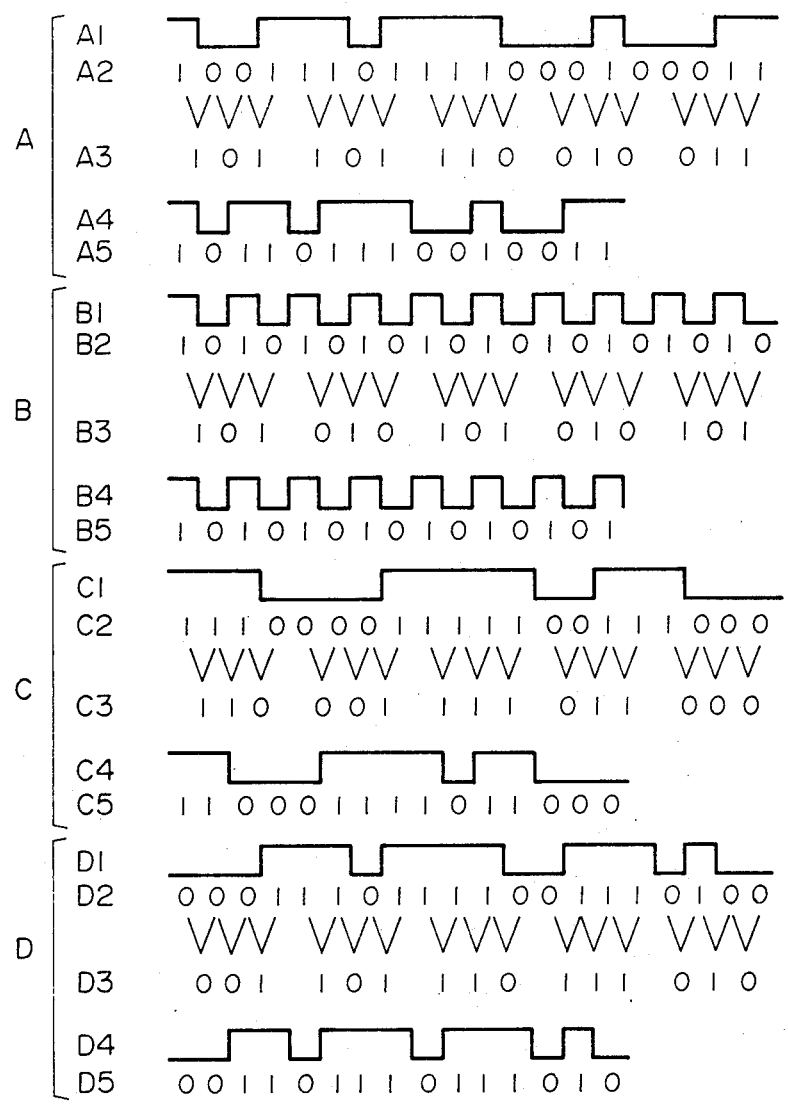
FIG. 6 illustrates a waveform for explaining a logic signal display method of the present invention.

The waveform compression method of the present invention will be discussed in detail hereinafter by reference to FIGS. 4 through 6, wherein FIG. 4 illustrates a flow chart for explaining the waveform compression operation of the present invention, FIG. 5 illustrates a model of the contents of the CPU RAM area and the display RAM area of RAM 28, and FIG. 6 illustrates in detail the waveform compression operation of the present invention.

In FIG. 4, when a number N is set to a predetermined value as when the operator inputs a waveform compression command by using keyboard 30, the following steps occur in sequence:

Step 40: A logical 0 is stored as data D0 in an address A0 of a temporary memory circuit in CPU 24;

Step 42: A first data bit stored in the first area of the CPU RAM (refer to FIG. 5) as data D1 is stored at an address A1 of the temporary memory (the contents of acquisition memory 14 have already been transferred to the first area of RAM 28);

Step 44: The next data bit stored in the CPU RAM is stored as data D2 in an address A2 of the temporary memory;

Step 46: The CPU determines whether or not the data D1 is equal to the data D2, and program flow is directed to step (48) if (YES), or to step (50) if (NO);

Step 48: The data bit D1 (or data bit D2) is stored at address A0;

Step 50: A data bit D0* (D0* is a reverse logic level of bit D0) is stored at address A0;

Step 52: The data bit stored at address A0 is stored in the second area of the CPU RAM (refer to FIG. 5);

Step 54: The data bit D2 at address A2 is stored at address A1 as the data bit D1;

Step 56: If all data bits in the first area of the CPU RAM (e.g. 252 bits for each channel) have not been processed according to steps 44–54, program flow is directed to step (58). Otherwise program flow is directed to step (62);

Step 58: If the comparison operation (the operation of step (46)) is repeated N times (N is an integer larger than two, for example three in this embodiment), program flow is directed to step (60). Otherwise program flow is directed to step (44);

Step 60: The next data of the first area of the CPU RAM is stored at address A1 of the temporary memory circuit as the data D1;

Step 62: The data of the second area of the CPU RAM is stored in the display RAM area as FONT information (refer to FIG. 5). This is the final step.

As is understood from the foregoing description, in step (58), when the comparison operation is repeated N times, the program proceeds to step (60). That is, after the comparison operation is sequentially repeated N times for an N+1 bit segment of data, the comparison operation is stopped. A next N+1 bit segment of waveform data is then obtained in step (60) and then the comparison operation is restarted. In FIG. 5 the designation "OOOO"-"FFFF" at the left indicate the addresses of RAM 28. RAM 28 further includes flag and stack areas, as well as for the first and second display areas shown in FIG. 5.

In FIG. 6, "A1"-"D1" respectively correspond to the waveforms A1-D1 of FIG. 2, and "A4"-"D4" respectively correspond to the waveforms A4-D4 of FIG. 3. In FIG. 6, the logic levels "1" and "0" of bit sequences A2-D2 respectively correspond to the logic levels of waveforms A1-D1, while bit sequences A5-D5 correspond to the logic levels obtained by the comparison operation of step (46) in FIG. 4 on bit sequences A2-D2.

Bit sequence A3 is derived from bit sequence A1 as follows. A logical "0" is stored as the data bit D0 at address A0 of the temporary memory circuit of CPU 24 (refer to step (40) in FIG. 4), and the first bit stored in the first area of the CPU RAM (i.e., a "1" bit at the leftmost bit position of the A2 sequence in FIG. 6) is stored as the data D1 at address A1 of the temporary memory circuit (refer to step (42) in FIG. 4). The next data of the CPU RAM (i.e., the "0" bit at the second leftmost position of the A2 in FIG. 6) is stored as bit D2 at address A2 of the temporary memory (refer to step (44) in FIG. 4). The D1 and D2 bits are compared (refer to step (46) in FIG. 4), and since the bits differ, a "1" bit is stored at address A0. The "1" bit stored at address A0 corresponds to the logic level "1" at the leftmost position of sequence A3. Since the comparison operation has been performed only one time, the next bit at the A2 sequence (the third leftmost bit "0" is then stored as the data bit D2 at address A2 of the temporary memory (refer to step (44) of FIG. 4) and the "0" bit previously stored at address A2 is stored as the D1 bit at address A1 in step (54). The D1 bit is compared to the D2 bit and since the D1 bit is equal to the D2 bit, the D1 bit (or the D2 bit, namely, "0") is stored at address A0. The "0" bit stored in this address A0 corresponds to the logic level "0" at the second leftmost position of the A3 sequence. Similarly, the logic level "1" at the third leftmost position of the A3 sequence is obtained via steps (52)–(58) and (46). Thus, if N is three, the comparison operation is repeated three times, so that the next bit stored in first area of the CPU RAM (i.e., the "1" bit at the fifth leftmost position of the A2 sequence) is stored as the D1 bit at address A1 of the temporary memory circuit as discussed at step (60) of FIG. 4.

The next data of the CPU RAM (i.e., the "1" bit at the sixth leftmost position of the A2 sequence) is stored as the D2 bit at address A2 of the temporary memory, and the above described operations are repeated. The logic levels at the fourth and fifth leftmost positions of the A2 sequence are not compared with each other. In other words, this embodiment stops the comparison operation after the comparison operation is repeated N times and then restarts the operation starting with the first two bits of the next N+1 bit section of the A2 sequence. When all data (for example, 252 bits for each channel) in the first area of the CPU RAM is processed, the data of the second area of the CPU RAM area is stored as the FONT information in the display RAM (refer to step (62) of FIG. 4). Since a method of compressing the waveforms B1-D1 to the B4-D4 waveforms of FIG. 6 is the same as the method of compressing the waveform A1 to the waveform A4, no further discussion thereof is included herein.

The software controlling CPU 24 in the preferred embodiment described with respect to FIGS. 4–6 is shown in Appendix A and B. The Appendix A is the program drafted with the "C" programming language and corresponding to the flow chart of FIG. 4, wherein the number of the comment (/*     */) in the Appendix A corresponds to the step number of the flow chart. Appendix B is the actual controlling program coding for the Z-80A microprocessor corresponding to the program of the Appendix A. In the Appendix B, LOC 0008–000C correspond to "D0=0" of the Appendix A; 000E–0025 to "i=j=0"; 0026–002A to "n=N"; 002C–0037 to "i<ALL"; 003A–0041 to "if(n==N)"; 0044–005A to "D1=RAM 1 [i]"; 005B–005F to "n=1"; 0061–0075 to "k=1=0"; 0076–0086 to "k<=j"; 0089–008D to "value=0"; 008F–0093 to "m=7"; 0095–009B to "m>=0"; 009E–00AE to "k<=j"; 00B1–00DC to "value:=RAM 2 [K]<<m"; 00DD–00E9 to "k++"; 00EA–00EF to "m− −"; 00F2–0018 to "D2=RAM [i]"; 0109–0115 to "if (D1==D2)"; 0118–0124 to "D0=D1"; 0127–013F to "D0=D0^1"; 0140–0156 to "RAM 2 [j]=D0"; 0157–0162 to "D1=D2"; 0163–0167 to "n++"; 0168–0174 to "j++"; 0175–0181 to "i++"; 0182–01B1 to "CRT[1++]=Value+0×80".

In FIG. 6, after the comparison operation is sequentially repeated three times, the operation is stopped only once and is again repeated. However, it is still necessary to control the waveform compression ratio by changing the sequential comparison number (N). If N is three, the waveform compression ratio is ¾. Generally, if the number of the sequential comparison is N, the waveform compression ratio is N/(N+1).

In the explanation relating to FIGS. 4 and 6, an initial condition is determined by storing "0" as the data D0 in the address A0 of the temporary memory (refer to step (40) of FIG. 4); however, "1" may be stored as the data D0. When the data D0 is "1" as the initial condition, the first logic level may be "Low" in the A4 waveform of FIG. 6. It may happen that the logic level of the first bit of the compressed waveform is different from the original waveform in the method of the present invention. However, the object of the present invention, to compress the waveform so as to display the outline of the original waveform on one display screen, is accomplished. To ensure that the first bit of the compressed waveform is correct, the data D0 of step (40) of FIG. 4 may be determined in accordance with the first bit level of the original waveform. If the first bit of the original waveform is "1", "0" is stored as the data D0 at step (40). If the first bit of the original waveform is "0", "1"

is stored as the initial data D0. For observing part of the waveform in detail, the original waveform may be displayed.

In the foregoing description relating to FIG. 4, the data of the second area of the CPU RAM is stored as the FONT information in the display RAM, after all the data in the first area of the CPU RAM is processed (refer to steps (56) and (62)). However, it may be possible to determine whether or not the second area stores the data corresponding to one FONT when each comparison operation finishes and to transfer the data of one FONT to the display RAM when the second area stores the output corresponding to one FONT. In other words, an additional step may be inserted between steps (54) and (56) of FIG. 4 for determining whether or not the second area of the CPU RAM stores the output from the address A0 seven times (one FONT consists of seven bits). If the second area of the CPU RAM has not as yet stored the output from the address A0 seven times, step (56) is followed. If the second area stores the output from the address A0 seven times, the additional step leads to another step wherein the seven outputs of the second area are stored as one FONT in the display RAM, followed by step (56). Step (62) is deleted. According to this modification, the second area of the CPU RAM may be small.

A page mode of the present invention will be discussed in conjunction with FIGS. 7 and 8 wherein the operator may select probes and probe tips corresponding to each display screen (page) with the keyboard. Input signals from the selected probes and probe tips corresponding to each page are displayed in one display screen. This operation includes the following steps:

1. The probe numbers and the probe tip numbers of each page as selected with the keyboard are stored in the CPU RAM as flags;
2. Data stored in the first area of the CPU RAM is read in order of the flags in the selected page;
3. The data read in step 2 is stored as the FONT information in the display RAM (one FONT consists of seven bits), and the selected page and probe tip numbers are stored as the FONT information in the display RAM.

Figure 7:
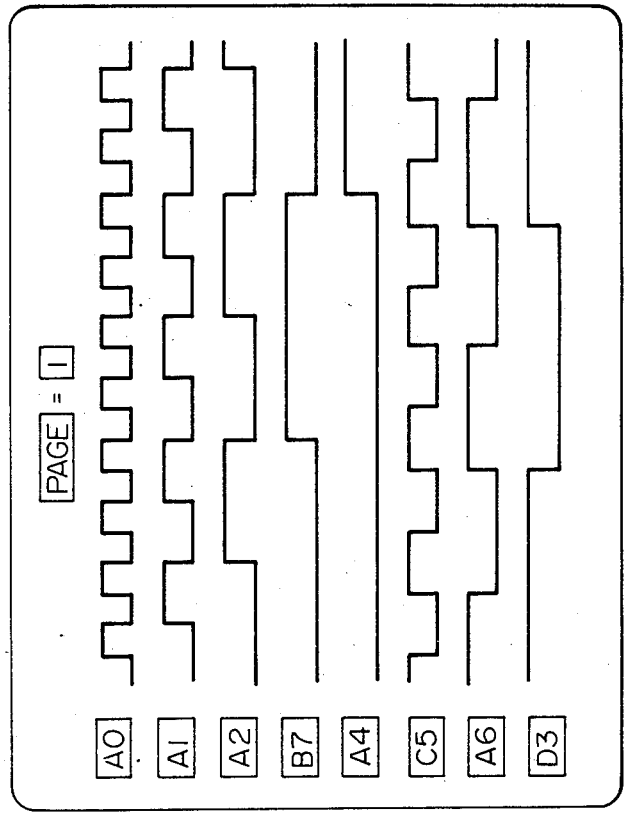
FIG. 7 illustrates a display screen for explaining the operation of FIG. 1.

FIG. 7 shows one example of the display screen illustrating the page mode of the present invention. In FIG. 7, "PAGE=1" in a square at the upper position indicates that the screen displays a first page, "A0-A3" in squares at the leftmost positions indicate the selected probes and probe tip numbers (i.e., the letters indicate the probes, and the numbers indicate the probe tips), and the waveforms to the right of "A0"-"D3" are the signal waveforms applied to the corresponding probe tips.

Figure 8:
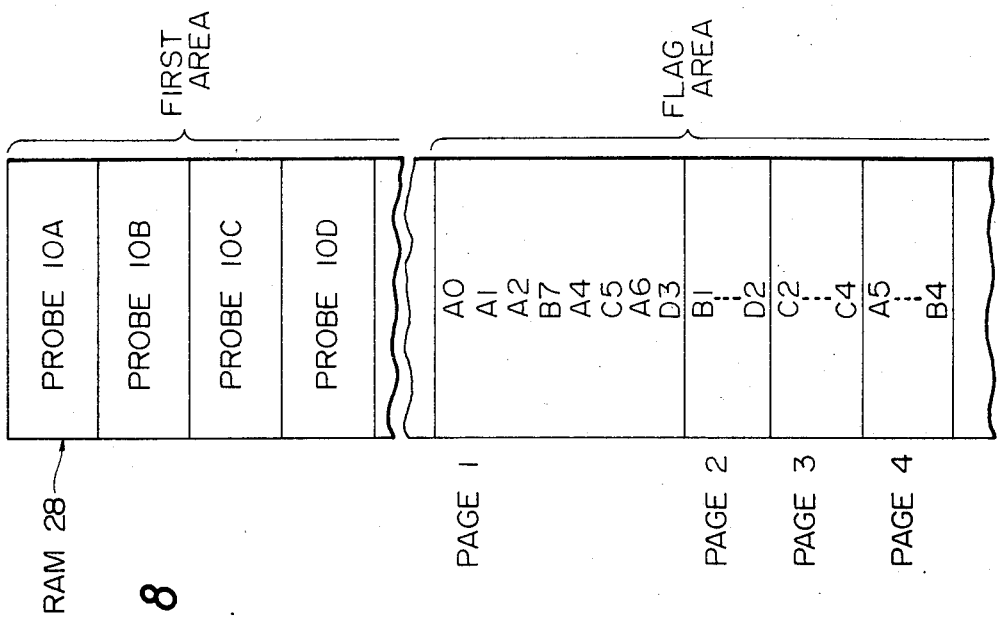
FIG. 8 illustrates the contents of a Random Access Memory (RAM) used in FIG. 1.

FIG. 8 illustrates a model of the contents of RAM 28, wherein the areas indicated by "Probe 10A" and "Probe 10D" are parts of the first area of RAM 28, and "Page 1"-"Page 4" are parts of the flag area. In FIG. 8, the first area of RAM 28 indicated by "Probe 10A"-"Probe 10D" stores the input signals from probes 10A-10D. Pages 1-4 of the flag area of RAM 28 store the flag data relating to the probes and the probe tips of the page selected by the operator with the keyboard. In the page mode, the operator can select with the keyboard the signals from the different probes and probe tips and cause them to be grouped for display in one display screen. Thus, it is easy to compare and observe the signals from the different probes and probe tips. Moreover, it is not necessary to connect predetermined probes and probe tips to predetermined points of a circuit under test.

As understood from the foregoing description, the present invention compresses a waveform consisting of a large number of bits, and displays the compressed waveform on the limited display area of the display means of the logic analyzer so that is is possible to observe the outline of a long signal waveform which cannot otherwise be displayed in one screen. Since the compression ratio can be selected for each waveform, various length input signals can be compressed by differing amounts for displaying them in one screen. Moreover, according to the page mode of the present invention, the desired input signals can be displayed in one display screen regardless of the connection relationship between the circuit under test and the probe tips.

While we have shown and described herein preferred embodiments of our invention, it will be apparent to those skilled in the art that many changes and modifications may be made without departing from our invention in its broader aspects. For example, the logic signal display method of the present invention is proper for the raster scan display system, but it may be applied to the X-Y display system. In this instance, the compressed data is applied to the Y-axis, and the ramp or staircase waveform is applied to the X-axis. Moreover, an indication may be displayed for notifying the operator when the input signal is compressed and displayed.

APPENDIX A

```
/***********************************************************************
 *  NAME       : timing()
 *  FUNCTION   : This display timing data   (display 4->3).
 *
 *  COMMENTS   : ex.
 *     RAM1[]--    1,0,0,1,1,0,1,0,0,1,1,1,0,0,1,1,1,0,1,1,0,0,1,1,1,...
 *     RAM2[]--   ( 1,0,1)( 0,1,0)( 1,1,1,)(0,1,1,)( 0,1,1)(0,1,1)(..
 *     value---   [    0x55    ][    0x6d    ][   .....
 *     CRT[]---   [    0xd5    ][    0xed    ][   .....
 *
 ***********************************************************************
 */
#define     ALL     252
#define     N       4
```

```
timing()
{
    extern unsisned char CRT[];
    extern char RAM1[];
    extern char RAM2[];
    char D0;
    char D1;
    char D2;
    char n;
    int i;                              /* i : counter for RAM1[] */
    int j;                              /* j : counter for RAM2[] */
    int k;                              /* k : counter for RAM2[] */
    char l;                             /* l : counter for CRT[] */
    char m;                             /* m : counter for bit */
    unsisned char value;                /* temporary value for CRT[] */
/*----------------------------------------*/
    D0 = 0;                             /* (RAM1[0] ^ 1)   # 40 */
    i = j = 0;
    n = N;

while (i < ALL){    /*# 56 */
        if (n == N){    /*# 58 */
            D1 =RAM1[i]; /*≠ 42, # 60 */
            n =1;
        }
        else{
            D2 = RAM1[i]; /*≠ 44 */ if (D1 == D2)  /*≠ 46 */
                D0 = D1;   /*# 48 */
            else
                D0 = D0 ^ 1;/*# 50 */
                RAM2[ j] = D0;    /*# 52 */
                D1 = D2;         /*# 54 */
                n ++;
                j ++;
        }
        i ++;
    }
/*--------------------------------*/
                            /* make font value by RAM2[] */
    k = l = 0;              /*# 62 */
    while (k <= j){
        value = 0;
        for (m = 7; m >= 0 && k <= j; m--){
            value :=RAM2[k] << m ;
            k ++;
        }
        CRT[l++] = value + 0xB0;
    }
}
```

APPENDIX B

```
> DIS 00 01FF
LOC    INST    MNEM  OPER           LOC    INST    MNEM  OPER
0000   CD0000  CALL  0000           0055   E3      EX    (SP),HL
0003   21EDFF  LD    HL,FFED        0056   C1      POP   BC
0006   39      ADD   HL,SP          0057   09      ADD   HL,BC
0007   F9      LD    SP,HL          0058   C1      POP   BC
0008   21F9FF  LD    HL,FFF9        0059   7E      LD    A,(HL)
000B   19      ADD   HL,DE          005A   02      LD    (BC),A
000C   3600    LD    (HL),00        005B   21F6FF  LD    HL,FFF6
000E   21F4FF  LD    HL,FFF4        005E   19      ADD   HL,DE
0011   19      ADD   HL,DE          005F   3601    LD    (HL),01
0012   E5      PUSH  HL             0061   C37501  JP    0175
0013   21F2FF  LD    HL,FFF2        0064   21F0FF  LD    HL,FFF0
0016   19      ADD   HL,DE          0067   19      ADD   HL,DE
0017   3E00    LD    A,00           0068   E5      PUSH  HL
0019   77      LD    (HL),A         0069   21EFFF  LD    HL,FFEF
001A   87      ADD   A,A            006C   19      ADD   HL,DE
001B   9F      SBC   A,A            006D   3600    LD    (HL),00
001C   23      INC   HL             006F   C1      POP   BC
001D   77      LD    (HL),A         0070   7E      LD    A,(HL)
001E   2B      DEC   HL             0071   02      LD    (BC),A
001F   C1      POP   BC             0072   87      ADD   A,A
0020   7E      LD    A,(HL)         0073   9F      SBC   A,A
0021   02      LD    (BC),A         0074   03      INC   BC
0022   23      INC   HL             0075   02      LD    (BC),A
0023   7E      LD    A,(HL)         0076   21F2FF  LD    HL,FFF2
0024   03      INC   BC             0079   19      ADD   HL,DE
0025   02      LD    (BC),A         007A   E5      PUSH  HL
0026   21F6FF  LD    HL,FFF6        007B   21F0FF  LD    HL,FFF0
0029   19      ADD   HL,DE          007E   19      ADD   HL,DE
002A   3604    LD    (HL),04        007F   C1      POP   BC
002C   21F4FF  LD    HL,FFF4        0080   0A      LD    A,(BC)
002F   19      ADD   HL,DE          0081   96      SUB   (HL)
0030   7E      LD    A,(HL)         0082   03      INC   BC
0031   D6FC    SUB   A,FC           0083   0A      LD    A,(BC)
0033   23      INC   HL             0084   23      INC   HL
0034   7E      LD    A,(HL)         0085   9E      SBC   A,(HL)
0035   DE00    SBC   A,00           0086   FA8501  JP    M,0185
0037   F26400  JP    P,0064         0089   21EDFF  LD    HL,FFED
003A   21F6FF  LD    HL,FFF6        008C   19      ADD   HL,DE
003D   19      ADD   HL,DE          008D   3600    LD    (HL),00
003E   7E      LD    A,(HL)         008F   21EEFF  LD    HL,FFEE
003F   FE04    CP    04             0092   19      ADD   HL,DE
0041   C2F200  JP    NZ,00F2        0093   3607    LD    (HL),07
0044   21F8FF  LD    HL,FFF8        0095   21EEFF  LD    HL,FFEE
0047   19      ADD   HL,DE          0098   19      ADD   HL,DE
0048   E5      PUSH  HL             0099   7E      LD    A,(HL)
0049   210000  LD    HL,0000        009A   87      OR    A
004C   E5      PUSH  HL             009B   FA8801  JP    M,0188
004D   21F4FF  LD    HL,FFF4        009E   21F2FF  LD    HL,FFF2
0050   19      ADD   HL,DE          00A1   19      ADD   HL,DE
0051   7E      LD    A,(HL)         00A2   E5      PUSH  HL
0052   23      INC   HL             00A3   21F0FF  LD    HL,FFF0
0053   66      LD    H,(HL)         00A6   19      ADD   HL,DE
0054   6F      LD    L,A            00A7   C1      POP   BC
```

APPENDIX B—CONTINUED

| LOC | INST | MNEM | OPER |
|---|---|---|---|
| 00A8 | 0A | LD | A,(BC) |
| 00A9 | 96 | SUB | (HL) |
| 00AA | 03 | INC | BC |
| 00AB | 0A | LD | A,(BC) |
| 00AC | 23 | INC | HL |
| 00AD | 9E | SBC | A,(HL) |
| 00AE | FA8801 | JP | M,0188 |
| 00B1 | 21EDFF | LD | HL,FFED |
| 00B4 | 19 | ADD | HL,DE |
| 00B5 | E5 | PUSH | HL |
| 00B6 | 210000 | LD | HL,0000 |
| 00B9 | E5 | PUSH | HL |
| 00BA | 21F0FF | LD | HL,FFF0 |
| 00BD | 19 | ADD | HL,DE |
| 00BE | 7E | LD | A,(HL) |
| 00BF | 23 | INC | HL |
| 00C0 | 66 | LD | H,(HL) |
| 00C1 | 6F | LD | L,A |
| 00C2 | E3 | EX | (SP),HL |
| 00C3 | C1 | POP | BC |
| 00C4 | 09 | ADD | HL,BC |
| 00C5 | 7E | LD | A,(HL) |
| 00C6 | 4F | LD | C,A |
| 00C7 | 87 | ADD | A,A |
| 00C8 | 9F | SBC | A,A |
| 00C9 | 47 | LD | B,A |
| 00CA | C5 | PUSH | BC |
| 00CB | 21EEFF | LD | HL,FFEE |
| 00CE | 19 | ADD | HL,DE |
| 00CF | 7E | LD | A,(HL) |
| 00D0 | 4F | LD | C,A |
| 00D1 | 87 | ADD | A,A |
| 00D2 | 9F | SBC | A,A |
| 00D3 | 47 | LD | B,A |
| 00D4 | C5 | PUSH | BC |
| 00D5 | CD0000 | CALL | 0000 |
| 00D8 | E1 | POP | HL |
| 00D9 | C1 | POP | BC |
| 00DA | 0A | LD | A,(BC) |
| 00DB | B5 | OR | L |
| 00DC | 02 | LD | (BC),A |
| 00DD | 21F0FF | LD | HL,FFF0 |
| 00E0 | 19 | ADD | HL,DE |
| 00E1 | 7E | LD | A,(HL) |
| 00E2 | C601 | ADD | A,01 |
| 00E4 | 77 | LD | (HL),A |
| 00E5 | 23 | INC | HL |
| 00E6 | 7E | LD | A,(HL) |
| 00E7 | CE00 | ADC | A,00 |
| 00E9 | 77 | LD | (HL),A |
| 00EA | 21EEFF | LD | HL,FFEE |
| 00ED | 19 | ADD | HL,DE |
| 00EE | 35 | DEC | (HL) |
| 00EF | C39500 | JP | 0095 |
| 00F2 | 21F7FF | LD | HL,FFF7 |
| 00F5 | 19 | ADD | HL,DE |
| 00F6 | E5 | PUSH | HL |
| 00F7 | 210000 | LD | HL,0000 |
| 00FA | E5 | PUSH | HL |
| 00FB | 21F4FF | LD | HL,FFF4 |
| 00FE | 19 | ADD | HL,DE |
| 00FF | 7E | LD | A,(HL) |
| 0100 | 23 | INC | HL |
| 0101 | 66 | LD | H,(HL) |
| 0102 | 6F | LD | L,A |
| 0103 | E3 | EX | (SP),HL |
| 0104 | C1 | POP | BC |
| 0105 | 09 | ADD | HL,BC |
| 0106 | C1 | POP | BC |
| 0107 | 7E | LD | A,(HL) |
| 0108 | 02 | LD | (BC),A |
| 0109 | 21F8FF | LD | HL,FFF8 |
| 010C | 19 | ADD | HL,DE |
| 010D | E5 | PUSH | HL |
| 010E | 21F7FF | LD | HL,FFF7 |
| 0111 | 19 | ADD | HL,DE |
| 0112 | C1 | POP | BC |
| 0113 | 0A | LD | A,(BC) |
| 0114 | BE | CP | (HL) |
| 0115 | C22701 | JP | NZ,0127 |
| 0118 | 21F9FF | LD | HL,FFF9 |
| 011B | 19 | ADD | HL,DE |
| 011C | E5 | PUSH | HL |
| 011D | 21F8FF | LD | HL,FFF8 |
| 0120 | 19 | ADD | HL,DE |
| 0121 | C1 | POP | BC |
| 0122 | 7E | LD | A,(HL) |
| 0123 | 02 | LD | (BC),A |
| 0124 | C34801 | JP | 0148 |
| 0127 | 21F9FF | LD | HL,FFF9 |
| 012A | 19 | ADD | HL,DE |
| 012B | E5 | PUSH | HL |
| 012C | 21F9FF | LD | HL,FFF9 |
| 012F | 19 | ADD | HL,DE |
| 0130 | 7E | LD | A,(HL) |
| 0131 | 4F | LD | C,A |
| 0132 | 87 | ADD | A,A |
| 0133 | 9F | SBC | A,A |
| 0134 | 47 | LD | B,A |
| 0135 | 79 | LD | A,C |
| 0136 | EE01 | XOR | 01 |
| 0138 | 4F | LD | C,A |
| 0139 | 78 | LD | A,B |
| 013A | EE00 | XOR | 00 |
| 013C | 47 | LD | B,A |
| 013D | E1 | POP | HL |

APPENDIX B – CONTINUED

| LOC | INST | MNEM | OPER |
|---|---|---|---|
| 013E | 79 | LD | A,C |
| 013F | 77 | LD | (HL),A |
| 0140 | 210000 | LD | HL,0000 |
| 0143 | E5 | PUSH | HL |
| 0144 | 21F2FF | LD | HL,FFF2 |
| 0147 | 19 | ADD | HL,DE |
| 0148 | 7E | LD | A,(HL) |
| 0149 | 23 | INC | HL |
| 014A | 66 | LD | H,(HL) |
| 014B | 6F | LD | L,A |
| 014C | E3 | EX | (SP),HL |
| 014D | C1 | POP | BC |
| 014E | 09 | ADD | HL,BC |
| 014F | E5 | PUSH | HL |
| 0150 | 21F9FF | LD | HL,FFF9 |
| 0153 | 19 | ADD | HL,DE |
| 0154 | C1 | POP | BC |
| 0155 | 7E | LD | A,(HL) |
| 0156 | 02 | LD | (BC),A |
| 0157 | 21F8FF | LD | HL,FFF8 |
| 015A | 19 | ADD | HL,DE |
| 015B | E5 | PUSH | HL |
| 015C | 21F7FF | LD | HL,FFF7 |
| 015F | 19 | ADD | HL,DE |
| 0160 | C1 | POP | BC |
| 0161 | 7E | LD | A,(HL) |
| 0162 | 02 | LD | (BC),A |
| 0163 | 21F6FF | LD | HL,FFF6 |
| 0166 | 19 | ADD | HL,DE |
| 0167 | 34 | INC | (HL) |
| 0168 | 21F2FF | LD | HL,FFF2 |
| 016B | 19 | ADD | HL,DE |
| 016C | 7E | LD | A,(HL) |
| 016D | C601 | ADD | A,01 |
| 016F | 77 | LD | (HL),A |
| 0170 | 23 | INC | HL |
| 0171 | 7E | LD | A,(HL) |
| 0172 | CE00 | ADC | A,00 |
| 0174 | 77 | LD | (HL),A |
| 0175 | 21F4FF | LD | HL,FFF4 |
| 0178 | 19 | ADD | HL,DE |
| 0179 | 7E | LD | A,(HL) |
| 017A | C601 | ADD | A,01 |
| 017C | 77 | LD | (HL),A |
| 017D | 23 | INC | HL |
| 017E | 7E | LD | A,(HL) |
| 017F | CE00 | ADC | A,00 |
| 0181 | 77 | LD | (HL),A |
| 0182 | C32C00 | JP | 002C |
| 0185 | C30000 | JP | 0000 |
| 0188 | 21EFFF | LD | HL,FFEF |
| 018B | 19 | ADD | HL,DE |
| 018C | 4E | LD | C,(HL) |
| 018D | 23 | INC | HL |
| 018E | 46 | LD | B,(HL) |
| 018F | C5 | PUSH | BC |
| 0190 | 21EFFF | LD | HL,FFEF |
| 0193 | 19 | ADD | HL,DE |
| 0194 | 34 | INC | (HL) |
| 0195 | E1 | POP | HL |
| 0196 | 7D | LD | A,L |
| 0197 | 4F | LD | C,A |
| 0198 | 87 | ADD | A,A |
| 0199 | 9F | SBC | A,A |
| 019A | 47 | LD | B,A |
| 019B | 69 | LD | L,C |
| 019C | 60 | LD | H,B |
| 019D | 010000 | LD | BC,0000 |
| 01A0 | 09 | ADD | HL,BC |
| 01A1 | E5 | PUSH | HL |
| 01A2 | 21EDFF | LD | HL,FFED |
| 01A5 | 19 | ADD | HL,DE |
| 01A6 | 7E | LD | A,(HL) |
| 01A7 | 4F | LD | C,A |
| 01A8 | 97 | SUB | A |
| 01A9 | 47 | LD | B,A |
| 01AA | 218000 | LD | HL,0080 |
| 01AD | 09 | ADD | HL,BC |
| 01AE | C1 | POP | BC |
| 01AF | 7D | LD | A,L |
| 01B0 | 02 | LD | (BC),A |
| 01B1 | C37600 | JP | 0076 |
| 01B4 | 00 | NOP | |
| 01B5 | 00 | NOP | |
| 01B6 | 00 | NOP | |
| 01B7 | 00 | NOP | |
| 01B8 | 00 | NOP | |

We claim:

1. A method of compressing a first binary bit sequence, the method comprising the steps of:

comparing a first and a second bit of said first sequence;

generating an output bit of a state matching said first bit if said first and second bits are of a similar state and generating an output bit of a first state if said first and said second bits are of differing states;

comparing each successive bit of said first sequence, except said first and second bits thereof, to its preceding bit; and generating an output bit of a state matching said preceding bit whenever any said successive bit and its preceding bit are of a similar state, and generating an output bit differing in state from a last generated output bit whenever any said successive bit and its preceding bit are of differing states, said output bits comprising a second binary bit sequence having one less bit than said first sequence.

2. A method of displaying a representation of a first sequence of binary bits in compressed form, the method comprising the steps of:
   a. comparing a first and a second bit of said first sequence, generating an output bit of a state matching said first bit if said first and second bits are of a similar state and generating an output bit of a first state if said first and said second bits are of differing states;
   b. comparing each successive bit of said first sequence, except said first and second bits thereof, to its preceding bit, generating an output bit of a state matching said preceding bit whenever any said successive bit and its said preceding bit are of a similar state, and generating an output bit differing in state from a last generated output bit whenever any said successive bit and its preceding bit are of differing states, said output bits comprising a second binary bit sequence having one less bit than said first sequence; and
   displaying a representation of said second sequence on a display screen.

3. A method of compressing a sequence of binary bits, the method comprising the steps of:
   a. dividing said sequence into a set of bit segments, each segment comprising a plurality of bits;
   b. comparing a first and a second bit of a first of said bit segments, generating an output bit of a state matching said first bit if said first and second bits of said first segment are of a similar state and generating an output bit of a first state if said first and said second bits are of differing states;
   c. comparing each successive bit of said first segment, except said first and second bits thereof, to its preceding bit, generating an output bit of a state matching said preceding bit whenever any said successive bit and its said preceding bit are of a similar state, and generating a output bit differing in state from a last generated output bit whenever any said successive bit and its preceding bit are of differing states;
   d. comparing a first and a second bit of a next bit segment, generating an output bit of a state matching said first bit if said first and second bits of said successive segment are of a similar state and generating an output bit of a state differing from a last generated output bit if said first and second bits are of differing states;
   e. comparing each successive bit of said next bit segment to its preceding bit, generating an output bit of a state matching said preceding bit whenever any said successive bit and its said preceding bit are of a similar state, and generating an output bit differing in state from a last generated output bit whenever any said successive bit and its preceding bit are of differing states; and
   f. repeating steps d and e for each successive segment of said sequence.

4. A method of displaying in compressed form a representation of a binary waveform, the method comprising the steps of:
   converting said waveform to a plurality of sequences composed of binary bits;
   comparing a first and a second bit of said first sequence, generating an output bit of a state matching said first bit if said first and second bits are of a similar state and generating an output bit of a first state if said first and said second bits are of differing states;
   comparing each successive bit of said first sequence, except said first and second bits thereof, to its preceding bit, generating an output bit of a state matching said preceding bit whenever said successive bit and its said preceding bit are of a similar state, and generating an output bit differing in state from a last generated output bit whenever said successive bit and its preceding bit are of differing states, said output bits comprising a second binary bit sequence having one less bit than said first sequence; and
   displaying a representation of said second sequence on a cathode ray tube.

5. A method as in claim 4 wherein said second sequence is displayed on said cathode ray tube by converting each successive bit of said second sequence to data suitable for controlling a display attribute of a raster scanning electron beam in said cathode ray tube, said display attribute being controlled according to the state of each said second sequence bit.

* * * * *